United States Patent [19]
Obszarny

[11] Patent Number: 6,163,367
[45] Date of Patent: Dec. 19, 2000

[54] APPARATUS AND METHOD FOR IN-SITU ADJUSTMENT OF LIGHT TRANSMISSION IN A PHOTOLITHOGRAPHY PROCESS

[75] Inventor: Christopher E. Obszarny, Poughkeepsie, N.Y.

[73] Assignee: International Business Machines Corporation, Armonk, N.Y.

[21] Appl. No.: 09/116,395

[22] Filed: Jul. 16, 1998

[51] Int. Cl.[7] ............................ G03B 27/42; G03B 27/72; F21V 9/14
[52] U.S. Cl. .................................. 355/53; 355/71; 362/19
[58] Field of Search ................................ 355/53, 18, 71; 430/5, 314, 322, 323, 311; 356/376; 362/19, 277, 282; 396/506

[56] References Cited

U.S. PATENT DOCUMENTS

| | | |
|---|---|---|
| 5,382,483 | 1/1995 | Young . |
| 5,464,713 | 11/1995 | Yoshioka et al. . |
| 5,506,080 | 4/1996 | Adair et al. . |
| 5,521,032 | 5/1996 | Imai et al. . |
| 5,541,026 | 7/1996 | Matsumoto . |
| 5,559,583 | 9/1996 | Tanabe ................................. 355/53 |
| 5,656,397 | 8/1997 | Imai et al. . |
| 5,902,705 | 5/1999 | Okamoto et al. ........................ 430/5 |
| 5,946,100 | 8/1999 | Ishihara ................................. 356/376 |
| 5,989,752 | 11/1999 | Chiu .......................................... 430/5 |

*Primary Examiner*—Russell Adams
*Assistant Examiner*—Peter B. Kim
*Attorney, Agent, or Firm*—DeLio & Peterson, LLC; Robert Curcio; Jay H. Anderson

[57] ABSTRACT

An adjustable, in-situ photolithography process is taught, where incident exposure light is passed through two polarizers; the first polarizer capable of altering its polarization direction, during exposure, relative to the polarization direction of the second polarizer, in order to enhance the contrast of a patterned image projected on a semiconductor wafer. The second polarizer in the optical train is a photo mask transparent substrate impregnated with colloidal crystals that are aligned in a fixed, predetermined direction by magnetic field. The photo mask may also contain a silicon compound for phase shifting the incident exposure light to further enhance the image contrast.

11 Claims, 4 Drawing Sheets

APPARATUS AND METHOD FOR IN-SITU ADJUSTMENT OF LIGHT TRANSMISSION IN A PHOTOLITHOGRAPHY PROCESS

BACKGROUND OF THE INVENTION

1. Field of the Invention

The present invention relates to photolithography, and more particularly to an apparatus and method for exposing lithographic features on a semiconductor wafer. Specifically, the present invention defines a method and apparatus for adjusting a light polarizer in combination with a photo mask (reticle) having a built-in polarizer, to regulate the transmission intensity of the light about an exposed pattern on a semiconductor substrate.

2. Description of Related Art

Photolithography techniques are commonly used in industry to produce integrated semiconductor circuits. The resolution of this process governs the ability to develop smaller and finer reduced images. Typically, in photolithography, a substrate is coated with a photo-resist, imaged with the desired circuit pattern, developed, and subjected to an etching process in the exposed areas. The photo-resist is applied as a light sensitive polymer that is subsequently used to protect selected areas during chemical treatment. The photolithography process generates a product (photo mask) that essentially becomes the primary tool in transferring an image onto a semiconductor substrate.

Photolithography demagnifies objects in order to produce images on the photo-resist layer of the semiconductor surface. Objects are reduced and imaged on the substrate in order to develop a pattern of microelectronic circuits on the photo-resist.

Mathematically, the resolution of this projected image is proportional to an exposure wavelength, $\lambda$, and inversely proportional to the numerical aperture, NA, of the optical system. The resolution may be expressed as:

$$R = K\lambda/(NA)$$

where,
R=resolution
K=process constant
$\lambda$=wavelength of exposure light
NA=numerical aperture of exposure system As miniaturization continues, efforts have been made to reduce the process constant, shorten the exposure wavelength, or increase the numerical aperture, in order to print finer, more resolute images. Nevertheless, during this miniaturization process, the demagnified objects projected on the photo-resist layer of the semiconductor surface must maintain the proper shape, light intensity profile, and contrast, in order to meet the minimum requirements for image transfer to the semiconductor substrate during production.

One method taught to enhance resolution is a phase shifting method, in which the improvement of the resolution and the increase in the depth of focus are intended by introducing a phase shift between light passing through adjacent transparent portions on a photo mask. In "IMPROVING RESOLUTION IN PHOTOLITHOGRAPHY WITH A PHASE-SHIFTING MASK", IEEE Transaction on Electronic Devices, Vol. ED-29, December 1982, by Levenson, phase-shifting masks were originally proposed to improve the pattern image resolution and tolerance controlled by creating out-of-phase destructive interference at the dark-light boundaries of adjacent apertures.

Generally, the phase shifted light will cause constructive and destructive interference patterns. This interference, in turn, directly affects the intensity of the transmitted light. A photo-resist and a spin-on-glass (SOG) material are each known as a material which forms the phase shifting properties, with the SOG material being structurally more robust.

In U.S. Pat. No. 5,656,397 issued to Imai et al., on Aug. 12, 1997, entitled, "MASK HAVING A PHASE SHIFTER AND METHOD OF MANUFACTURING THE SAME", a method of manufacturing a photo mask having a phase shifter which can control the phase of exposure light was introduced. In the Imai invention, a phase shifter is formed on a glass plate substrate such that fluctuations in the film thickness of the phase shifter are minimized in the areas where the dimension or density of the light shielding pattern is different. The effect is to alter the phase of light passing through a first transparent area in the mask and the phase of light passing through a second transparent area in the mask, such that the joined light is canceled from each other (destructive interference) thereby greatly reducing the light intensity. Thus, phase information and amplitude information are employed to generate enhanced image characteristics.

A phase-shift is developed when light is transmitted through a transparent material exhibiting a temporal phase-shifting that can be represented by:

$$\Delta\phi = 2\pi(n-1)d/\lambda$$

where,
$\Delta\phi$ is the phase-shift in radians;
n is the index of refraction of the transmission material;
d is the thickness of the material in meters; and
$\lambda$ is the wavelength of the exposing light in meters.

The technique of adding phase shifted information to the amplitude information of the transmitted light, although employed to further enhance the resolution of reduced images, remains limited in the resultant image performance. Consequently, the art has continually progressed to eventually incorporating a third form of light information, polarization, as a means to establish satisfactory high contrast images.

In U.S. Pat. No. 5,541,026 issued to Matsumoto on Jul. 30, 1996, entitled, "EXPOSURE APPARATUS AND PHOTO MASK", an exposure apparatus is taught for transferring the pattern contained in a photo mask onto a substrate by illuminating the photo mask using a projection optical system and a polarizer at the position of the incident pupil of the optical system. A polarizer is added to each light transmission portion in the photo mask such that the polarizers, in combination, produce polarized beam conditions perpendicular to each other. Although the Matsumoto invention teaches the effects of using polarization to change the frequency and distribution of the diffraction pattern in order to increase image resolution, this must be predetermined in advance. Thus, there is no provision for varying the polarization in-situ, i.e., adjusting the light intensity during light transmission or exposure such that the polarizers are not always situated to be perpendicular to each other.

Bearing in mind the problems and deficiencies of the prior art, it is therefore an object of the present invention to provide an apparatus and method for enhancing the contrast of a lithographic image.

It is another object of the present invention to provide an apparatus and method for adjusting the light intensity during the exposure of a photolithographic image.

A further object of the invention is to provide an apparatus and method for developing an in-situ adjustable photolithographic device.

It is yet another object of the present invention to provide an apparatus and method for forming patterns on a semiconductor substrate using a photo mask polarizer and a separate rotating polarizer.

Another object of the present invention is to replace several attenuated masks, e.g., 0.5%, 1%, and 6% reticles with one attenuated reticle that can be adjusted in-situ.

Still other advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an apparatus for varying the transmission intensity in a photolithography process comprising: a light source for optically transmitting an incident electromagnetic radiation beam with a predetermined frequency spectrum; a first polarizer capable of adjustment during the optical transmission such that the contrast of an optical image focused on a substrate wafer is variable, the adjustment made relative to a second polarizer; electromagnetic radiation beam focusing means for concentrating the beam on the first polarizer; a photo mask patterned with a plurality of optically transparent and optically opaque regions, wherein the transparent regions are impregnated with the second polarizer, fixed in a predetermined direction, such that the photo mask develops a diffraction pattern of the optical image during optical transmission; and, electromagnetic radiation beam image reducing means to reduce and focus the diffraction pattern on the substrate wafer. The photo mask may be comprised of a patterned spin-on-glass layer for phase shifting the transmitted electromagnetic radiation; and, a patterned metal layer for blocking transmission of the electromagnetic radiation. Also, the focusing means and the image reducing means may be comprised of a plurality of optical lenses.

In the preferred embodiment, the first polarizer is rotatable in a plane normal to the direction of the incident electromagnetic radiation such that the direction of electric vector components of the electromagnetic radiation emerging from the first polarizer is adjustable over a dynamic range encompassing a position parallel to the fixed position of the second polarizer, to a position perpendicular to the fixed position of the second polarizer.

Additionally, the photo mask opaque layer may be comprised of a metal layer of chromium, molybdenum, aluminum, tungsten, or titanium.

The present invention is directed to, in a second aspect, a method for forming a pattern on a substrate wafer in a photolithography process comprising the steps of: providing a light source for optically transmitting an incident electromagnetic radiation beam with a predetermined frequency spectrum; focusing the incident electromagnetic radiation beam for concentrating the beam on a first polarizer; providing a patterned photo mask with a plurality of optically transparent and optically opaque regions, wherein the transparent regions are impregnated with a second polarizer, fixed in a predetermined direction; rotating the first polarizer relative to the second polarizer during optical transmission; and, developing a diffraction pattern on the substrate such that the diffraction pattern light intensity is adjustable by rotating the first polarizer. The photo mask may include a phase shifting layer to enhance the contrast of the diffraction pattern.

In this second aspect, providing a patterned photo mask, may comprise the following steps: providing a transparent substrate; applying a silicon compound layer to the transparent substrate using a spin-on-glass technique; adding polarizable crystals of a colloidal size to the silicon compound layer; subjecting the transparent substrate with the polarized crystals to a magnetic field sufficient to align the crystals in a predetermined direction, before and during a curing stage; depositing an opaque metal layer; adding a patterned photoresist over the metal layer; etching or cutting the metal layer; and removing the spin-on-glass layer to the pattern of the photoresist.

The polarizable crystals added to the silicon compound layer may be added at a concentration level of 2000 parts per million. Also, the opaque layer may be deposited with a 0.1% optical transmissivity.

The present invention is directed to, in a third aspect, a method for forming a pattern on a substrate wafer in a photolithography process comprising the steps of: providing an incident electromagnetic radiation beam; focusing the beam on an adjustable first polarizing device; polarizing the beam with the adjustable first polarizing device; masking the beam with a photo mask patterned to develop an optical image; polarizing the beam with a fixed second polarizing device within the photo mask; reducing the optical image transmitted through the photo mask onto the substrate; and, adjusting the intensity of the beam by varying the direction of the adjustable first polarizing device with respect to the direction of the fixed second polarizing device.

In this third aspect, polarizing of the beam with a fixed second polarizing device within the photo mask may further comprise phase-shifting the beam to further enhance the contrast of the image.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
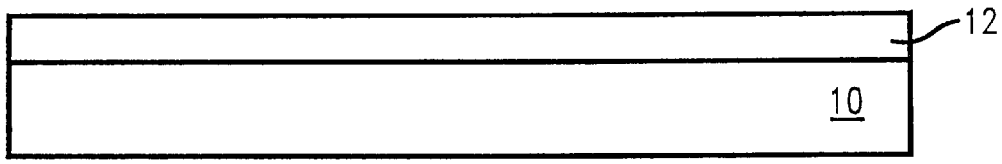
FIG. 1A is a cross-section view of a transparent substrate layered with spin-on-glass.

In describing the preferred embodiment of the present invention, reference will be made herein to FIGS. 1–5 of the drawings in which like numerals refer to like features of the invention. Features of the invention are not necessarily shown to scale in the drawings.

In recent advances in photolithography the photo mask (reticle) has been modified to function as a phase shifter and polarizer for the exposure light. The current invention relates a standard phase-shifted photo mask having a polarizing film in the phase shifting layer in combination with a separate polarizer in the optical path. The separate polarizer is situated before the photo mask to receive and polarize the incident electromagnetic radiation. The emerging polarized radiation is then incident on the photo mask. As shown in FIG. 1A, a transparent substrate 10, or optically transmissive blank, is used as the base for the patterned photo mask. Preferably, a standard quartz or borosilicate glass plate is employed for this purpose. This plate is typically highly transparent over a broad spectrum of light frequencies.

A silicon compound layer 12 is then formed by coating substrate 10 with a spin-on-glass (SOG) material. This material is typically a silanol compound or monohydroxy derivative of silane, along with a solvent, e.g., methanol. The compound is then heated to evaporate the solvent, although, if this combination is volatile this step can be omitted. This silicon compound, when properly configured, will provide a transparent layer for shifting the phase of the exposure light as it traverses the photo mask.

The level of insolubility of the SOG as the solvent is slowly evaporated should be closely monitored since the SOG layer becomes more difficult to dissolve in an organic solvent.

Polarizable crystals of colloidal size are then added to the SOG. The concentration of the colloidal crystals is approximately 2000 ppm, in order to cause the desired polarizing effect. The crystal SOG is applied as per normal processing found in the industry with one exception. Before and during the curing stage, the photo mask must be placed in a magnetic field sufficient enough to align the crystals in order to have them act as polarizers for the incident exposure light.

Figure 1B:
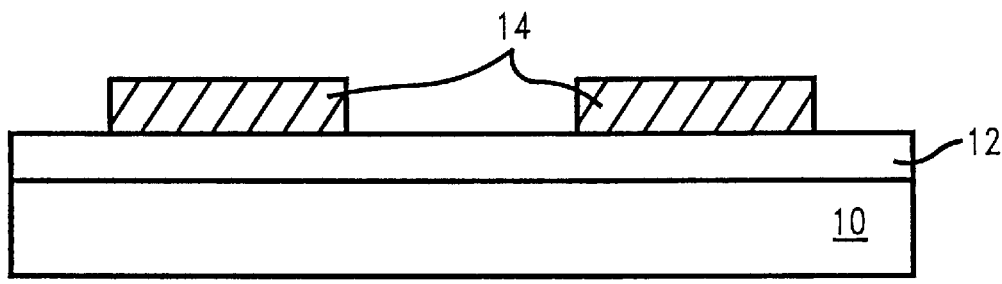
FIG. 1B is the layered transparent substrate of FIG. 1A with an added opaque metal layer.

Once the SOG layer is hardened, a substantially opaque metal layer 14, preferably a chromium film, is then deposited through sputter or vapor phase deposition on the layered glass substrate and patterned to shield light in predetermined areas. The level of opaqueness is preferably on the order of less than 0.1% optical transmissivity over the incident light's frequency range. While a chromium film is preferred as the light shielding film, it is possible to use other films opaque to the exposure light, for example, molybdenum silicide film, aluminum, tungsten, titanium, and their various oxides and silicon based compounds. The pattern is typically an electrical circuit configuration for a semiconductor device. Photo-resist is then applied (not shown), using normal processes found in industry, and patterned with industry standard energy. The metal layer 14 is then etched to transfer the desired pattern into the hard mask, as shown in FIG. 1B.

Patterning of the chromium film is generally accomplished by etching but may be performed by electron beam writing, although still other techniques standard in the art may be employed.

Figure 1C:
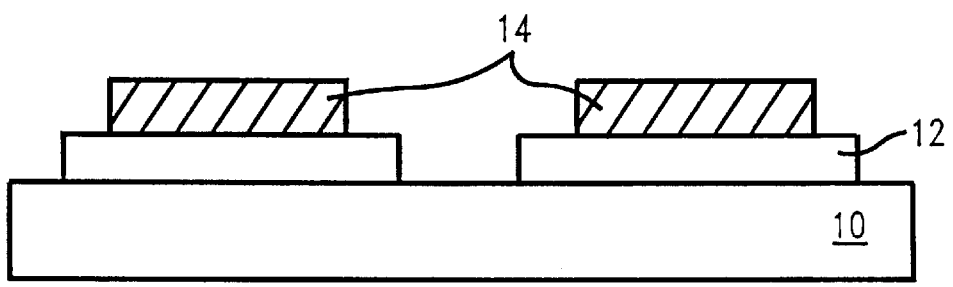
FIG. 1C is the layered substrate of FIG. 1B with the layers patterned to expose opaque portions and transparent portions forming a photo mask.

Referring to FIG. 1C, the polarized SOG layer 12 is then patterned to match the etched chromium layer, resulting in a photo mask with polarizing SOG 16.

Figure 2:
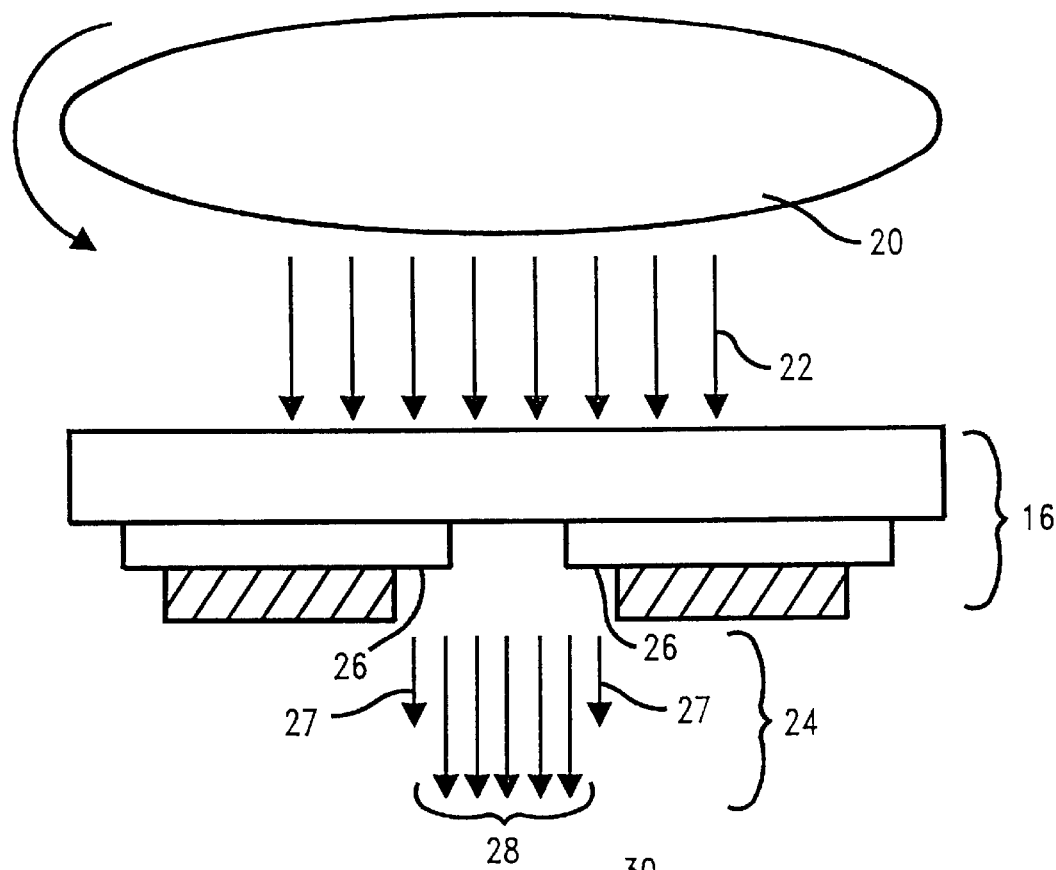
FIG. 2 is a cross-section of the two polarizers of the current invention working in tandem.

FIG. 2 depicts the workings of the photo mask with polarized SOG 16 together with a rotating, adjustable polarizer 20. Incident electromagnetic radiation (exposure light) traverses through polarizer 20, rotatable along an axis parallel to the exposure light, and emerges as polarized light 22 with respect to the transverse electric field vector component direction of the incident light.

A polarizer transmits only those light beams whose electric field vectors vibrate in a direction parallel to the aligned polarized crystals. By aligning the vibrating electric field vectors emerging from the polarizer 20 with the polarized diffraction beam from the photo mask with polarizing SOG 16, the interference between diffracted beams is increased. This, in turn, enhances the contrast in the diffraction pattern illuminated on a semiconductor substrate. Any alteration to the alignment of the two polarizers will directly affect the exposure light's transmission and intensity. If the polarized light traversing the rotating polarizer 20 is out of alignment, i.e., not parallel, with the predetermined direction of the polarized sections 26 of the photo mask, less light will traverse through these regions to the focal plane. Thus, by rotating the polarizer 20, local light intensity may be varied so that the contrast of the resultant diffraction pattern may be adjusted during exposure. Developing an in-situ adjustable photolithography device allows for error correction and compensation in the fixed photo mask polarizer.

The light transmitted through the photo mask with polarizing SOG 16 is shown with a different intensity spectrum dependent upon whether the light beams traversed both polarizers or only one. As depicted by the length of the light beam rays 24 in FIG. 2, the resultant intensity of the light traversing the polarizing, phase-shifted region 26 of the photo mask with polarizing SOG 16 is attenuated. The higher intensity light beam rays 28 depicted in FIG. 2 are shown with longer light rays than the lower intensity light rays 27 traversing through the photo mask polarizing sections 26.

Figure 3:
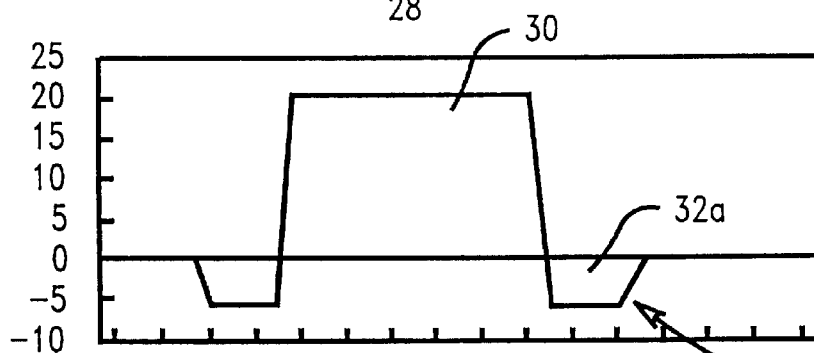
FIG. 3 is a graph of the transmitted light intensity incident on the focal plane from the polarizers of FIG. 2.
Figure 3:
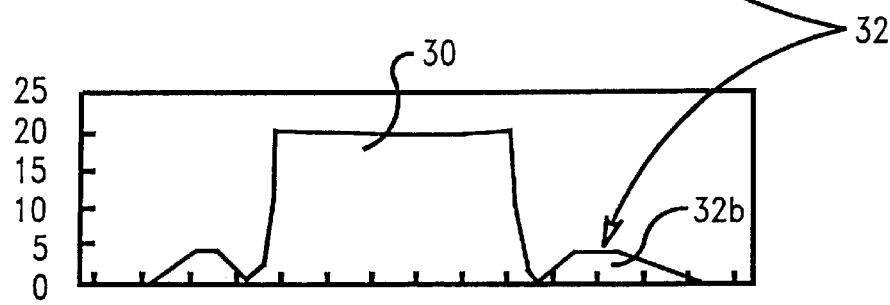

Referring to FIG. 3, the intensity of the incident diffraction pattern at the focal plane 30 is graphed with the resultant attenuated regions 32 shown in varying degrees of attenuation (32a, 32b). These attenuated regions 32 correspond to the lower intensity light 27 (FIG. 2) from the photo mask. The lower light intensity areas are generated by simply rotating the initial polarizer 20 with respect to the fixed photo mask polarizer such that the electric vector components are not parallel with the predetermined photo mask polarizer direction. Minimum light transmission will occur when the polarizers are perpendicular to each other. By rotating the first polarizer 20 at angles between 0 and 90 degrees, an in-situ adjustment of light transmission and intensity is achieved. Unlike the prior art, this transmission is controlled through a full dynamic range of zero intensity to maximum intensity, rather than remaining at an unadjustable, predetermined fixed condition.

Figure 4:
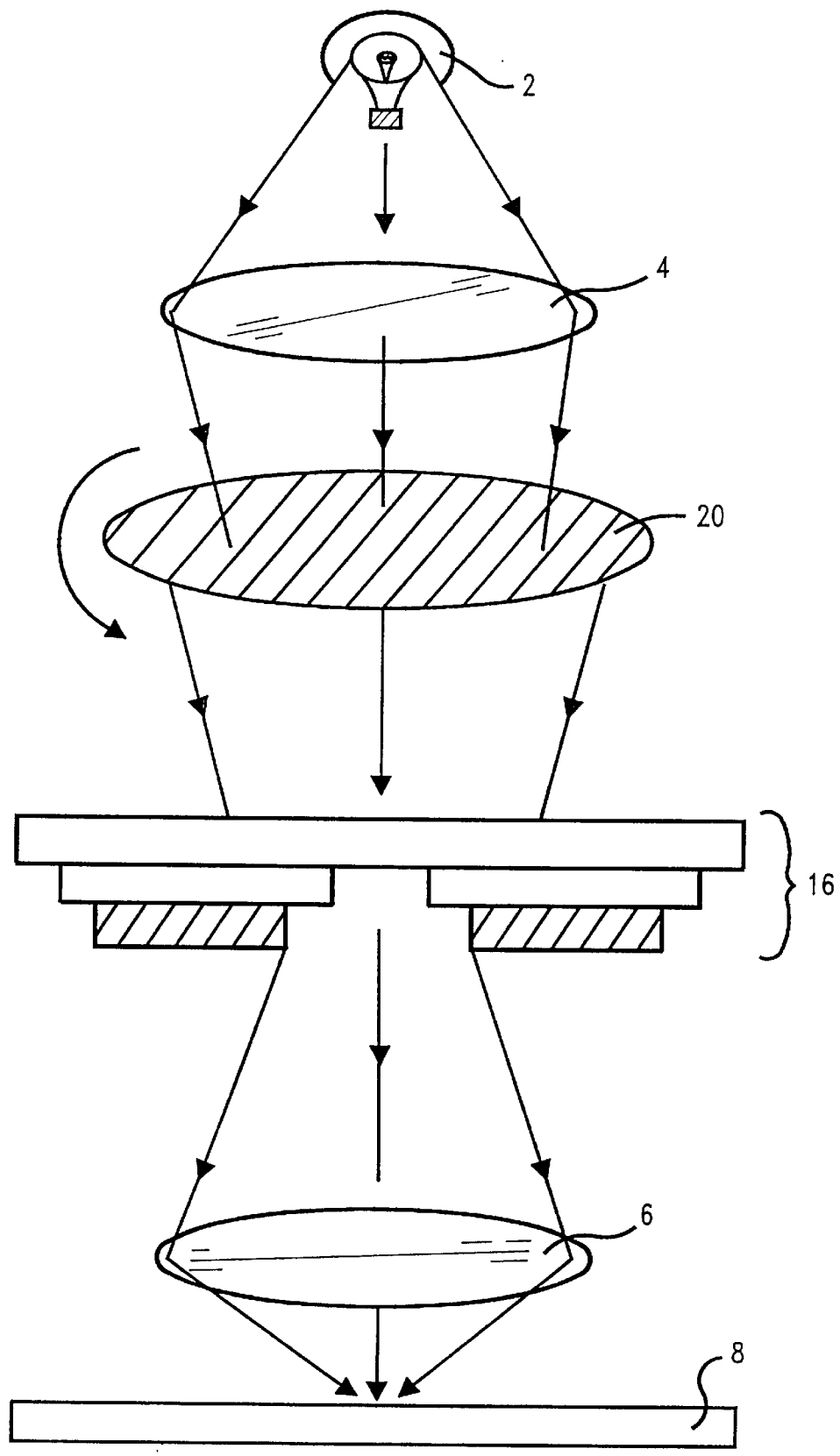
FIG. 4 is a cross-section of the apparatus of the current invention with a rotating polarizer in the optical train.

The apparatus of the present invention is shown in FIG. 4. A light source 2 is focused with projection optics 4 to be incident on a rotatable polarizer 20, preferably a motor driven optical polarizer. The light emerging from the polarizer is aligned such that the electric field vectors all point in the same direction. The light may be linearly polarized, circularly polarized, or elliptically polarized. This determination is dependent upon the type of polarizer in the photo mask. Importantly, the direction of the polarized light emerging from the polarizer 20 is adjustable by further rotation of the polarizer.

The polarized light then falls incident on a photo mask with polarizing SOG 16 that is preferably patterned with a predetermined circuit layout for a semiconductor device. The photo mask, having been previously impregnated with a colloidal suspension and subjected to an aligning magnetic field, further polarizes the incident light. The photo mask may also have a phase shift layer that can enhance contrast through destructive interference of the phase shifted light beams emerging from the photo mask diffraction pattern.

Projection optics 6 then demagnify or reduce the patterned image onto a semiconductor wafer 8, fabricated with a photo-sensitive layer for accepting the adjustable diffracted pattern. Both sets of projection optics are typically focusing and reducing lenses that have operational characteristics over the frequency spectrum of the exposure light.

Figure 5:
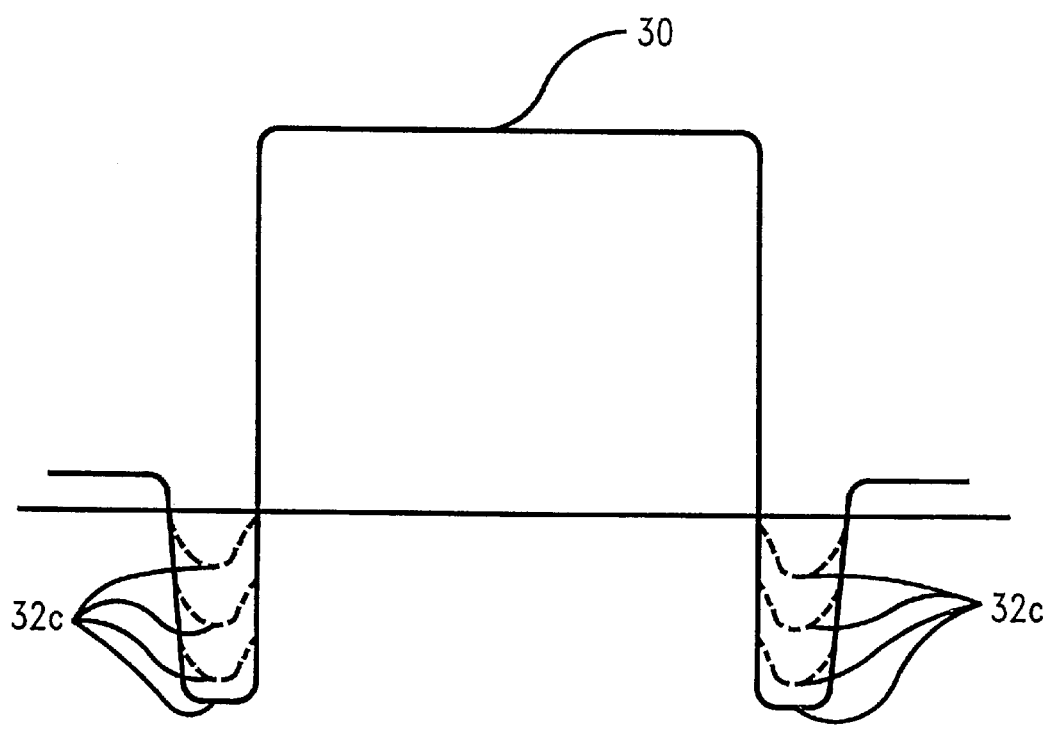
FIG. 5 is a graph of the transmitted light intensity incident on the focal plane, depicting the adjustable variation in the diffraction pattern.

FIG. 5 depicts the resultant adjustable light intensity regions 32c on the focal plane.

The method for adjusting the contrast of the image reduced on the substrate wafer during the photolithography process includes the necessary steps of: providing an incident electromagnetic radiation beam of a predetermined frequency spectrum; focusing the light beam on an adjustable first polarizing device that, in turn, polarizes the light traversing it; masking the light beam with a transparent photo mask having transparent and opaque layers patterned to produce an optical image; polarizing the light beam with a fixed second polarizing device in a direction parallel to the predetermined direction of the colloidal crystals in the second polarizing device pre-aligned by a magnetic field; reducing the optical image transmitted through the photo mask onto a substrate wafer; and adjusting the intensity of the light beam by varying the direction of the adjustable first polarizing device with respect to the direction of the fixed (predetermined) second polarizing device.

By performing this method with the aforementioned apparatus the current invention provides for enhancing the contrast of the lithographic image incident on the semiconductor substrate during the lithography process.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for varying optical transmission intensity on a substrate wafer in a photolithography process comprising:
   a first polarizer capable of adjustment during optical transmission such that an optical image focused on said substrate wafer is varied in contrast, said adjustment made relative to a second polarizer; and,
   a photo mask patterned with a plurality of optically transparent and optically opaque regions, wherein said transparent regions are impregnated with said second polarizer fixed in a predetermined direction, and said opaque regions comprise a patterned metal film on said substrate, such that said photo mask develops a diffraction pattern of said optical image during said optical transmission.

2. The apparatus of claim 1 further comprising:
   a light source for optically transmitting an incident electromagnetic radiation beam with a predetermined frequency spectrum;
   electromagnetic radiation beam focusing means for concentrating said beam on said first polarizer; and, electromagnetic radiation beam image reducing means to reduce and focus said diffraction pattern on said substrate wafer.

3. The apparatus of claim 1 wherein said photo mask comprises:
   a patterned spin-on-glass layer for phase shifting said transmitted electromagnetic radiation, said spin-on-glass layer impregnated with polarizing members; and,
   a patterned metal layer for blocking transmission of said electromagnetic radiation.

4. The apparatus of claim 2 wherein said focusing means and said image reducing means comprise a plurality of optical lenses.

5. The apparatus of claim 2 wherein said first polarizer rotates in a plane normal to the direction of said incident electromagnetic radiation such that the direction of electric vector components of said electromagnetic radiation emerging from said first polarizer is adjustable over a dynamic range encompassing a position parallel to said fixed position of said second polarizer, to a position perpendicular to said fixed position of said second polarizer.

6. The apparatus of claim 3 wherein said photo mask opaque layer comprises a metal layer of chromium, molybdenum, aluminum, tungsten, or titanium.

7. An apparatus for varying the transmission intensity in a photolithography process comprising:
   a light source for optically transmitting an incident electromagnetic radiation beam with a predetermined frequency spectrum;
   a first polarizer capable of adjustment during optical transmission such that an optical image focused on a substrate wafer is varied in contrast, said adjustment made relative to a second polarizer;
   focusing optics for concentrating said beam on said first polarizer;
   a photo mask patterned with a plurality of optically transparent and optically opaque regions, wherein said transparent regions are impregnated with said second polarizer fixed in a predetermined direction, and said opaque regions comprise a patterned metal film on said substrate, such that said photo mask develops a diffraction pattern of said optical image during said optical transmission; and,
   reducing optics to reduce and focus said diffraction pattern on said substrate wafer.

8. The apparatus of claim 7 further comprising a photo mask with a phase shifting layer to enhance the contrast of said diffraction pattern.

9. The apparatus of claim 7 wherein said optically opaque region has an optical transmissivity level of 0.1%.

10. An apparatus for varying optical transmission intensity on a substrate wafer in a photolithography process comprising:
    a first polarizer capable of adjustment during optical transmission such that an optical image focused on said substrate wafer is varied in contrast, said adjustment made relative to a second polarizer; and,
    a photo mask comprising a transparent substrate, a patterned metal film on said substrate, and a spin-on-glass layer, said spin-on-glass layer impregnated with said second polarizer fixed in a predetermined direction, such that said photo mask develops a diffraction pattern of said optical image during said optical transmission.

11. An apparatus for varying the transmission intensity in a photolithography process comprising:
    a light source for optically transmitting an incident electromagnetic radiation beam with a predetermined frequency spectrum;
    a first polarizer capable of adjustment during optical transmission such that an optical image focused on a substrate wafer is varied in contrast, said adjustment made relative to a second polarizer;
    focusing optics for concentrating said beam on said first polarizer;
    a photo mask comprising a transparent substrate, a patterned metal film on said substrate, and a spin-on-glass layer, said metal film being opaque to polarized light, said spin-on-glass layer impregnated with said second polarizer fixed in a predetermined direction, such that said photo mask develops a diffraction pattern of said optical image during said optical transmission; and,
    reducing optics to reduce and focus said diffraction pattern on said substrate wafer.

* * * * *